United States Patent
Osanai et al.

(10) Patent No.: US 9,944,565 B2
(45) Date of Patent: Apr. 17, 2018

(54) METAL/CERAMIC BONDING SUBSTRATE AND METHOD FOR PRODUCING SAME

(71) Applicants: DOWA METALTECH CO., LTD, Tokyo (JP); TOKUYAMA CORPORATION, Yamaguchi (JP)

(72) Inventors: Hideyo Osanai, Nagano (JP); Yukihiro Kitamura, Nagano (JP); Hiroto Aoki, Yamaguchi (JP); Yukihiro Kanechika, Yamaguchi (JP); Ken Sugawara, Yamaguchi (JP); Yasuko Takeda, Ibaraki (JP)

(73) Assignees: DOWA METALTECH CO., LTD., Tokyo (JP); TOKUYAMA CORPORATION, Tamaguchi (JP)

( * ) Notice: Subject to any disclaimer, the term of this patent is extended or adjusted under 35 U.S.C. 154(b) by 118 days.

(21) Appl. No.: 14/443,505

(22) PCT Filed: Nov. 20, 2012

(86) PCT No.: PCT/JP2012/080521
§ 371 (c)(1),
(2) Date: May 18, 2015

(87) PCT Pub. No.: WO2014/080536
PCT Pub. Date: May 30, 2014

(65) Prior Publication Data
US 2015/0284296 A1 Oct. 8, 2015

(51) Int. Cl.
*B21D 39/00* (2006.01)
*C04B 37/02* (2006.01)
(Continued)

(52) U.S. Cl.
CPC ............ *C04B 37/02* (2013.01); *B23K 1/19* (2013.01); *B32B 15/04* (2013.01); *B32B 18/00* (2013.01);
(Continued)

(58) Field of Classification Search
None
See application file for complete search history.

(56) References Cited

U.S. PATENT DOCUMENTS 5,354,415 A * 10/1994 Fushii .............. H05K 3/06
216/108
5,798,566 A * 8/1998 Sato .............. H01L 23/367
257/703
(Continued)

FOREIGN PATENT DOCUMENTS

JP   08255973 A    10/1996
JP   H10284813  * 10/1998 .......... H05K 1/03
(Continued)

OTHER PUBLICATIONS

European Search Report for 12888855.9 dated May 4, 2016.

*Primary Examiner* — Seth Dumbris
(74) *Attorney, Agent, or Firm* — Bachman & LaPointe, PC

(57) ABSTRACT

After a wet blasting treatment for jetting a slurry, which contains spherical alumina as abrasive grains in a liquid, to the surface of a ceramic substrate 10 of aluminum nitride sintered body so that the ceramic substrate 10 has a residual stress of not higher than −50 MPa and so that the surface of the ceramic substrate 10 to be bonded to the metal plate 14 has an arithmetic average roughness Ra of 0.15 to 0.30 μm, a ten-point average roughness Rz of 0.7 to 1.1 μm and a maximum height Ry of 0.9 to 1.7 μm while causing the ceramic substrate to have a flexural strength of not higher than 500 MPa and causing the thickness of a residual stress
(Continued)

layer 10a formed along the surface of the ceramic substrate 10 to be 25 µm or less, the metal plate 14 of copper or a copper alloy is bonded to the ceramic substrate 10, which is obtained by the wet blasting treatment, via a brazing filler metal 12 to produce a metal/ceramic bonding substrate which has an excellent bonding strength of the ceramic substrate 10 to the metal plate 14 and which has an excellent heat cycle resistance.

16 Claims, 1 Drawing Sheet

(51) Int. Cl.
    *H05K 1/03* (2006.01)
    *H05K 3/02* (2006.01)
    *H01L 23/373* (2006.01)
    *B23K 1/19* (2006.01)
    *B32B 15/04* (2006.01)
    *B32B 18/00* (2006.01)
    *C04B 35/581* (2006.01)
    *C04B 41/91* (2006.01)
    *H05K 3/38* (2006.01)

(52) U.S. Cl.
    CPC .......... *C04B 35/581* (2013.01); *C04B 37/026* (2013.01); *C04B 41/91* (2013.01); *H01L 23/3735* (2013.01); *H05K 1/0306* (2013.01); *H05K 3/022* (2013.01); *C04B 2235/96* (2013.01); *C04B 2235/963* (2013.01); *C04B 2237/125* (2013.01); *C04B 2237/127* (2013.01); *C04B 2237/366* (2013.01); *C04B 2237/407* (2013.01); *C04B 2237/52* (2013.01); *C04B 2237/704* (2013.01); *C04B 2237/706* (2013.01); *H01L 2924/0002* (2013.01); *H05K 3/38* (2013.01); *Y10T 428/24355* (2015.01)

(56) References Cited

U.S. PATENT DOCUMENTS

| | | | |
|---|---|---|---|
| 6,261,703 | B1 | 7/2001 | Sasaki et al. |
| 6,569,514 | B2 | 5/2003 | Naba et al. |
| 8,791,566 | B2 | 7/2014 | Yamaguchi et al. |
| 2002/0060091 | A1 | 5/2002 | Naba et al. |
| 2007/0297162 | A1* | 12/2007 | Negishi ............... H01L 21/4846 361/820 |
| 2012/0038038 | A1 | 2/2012 | Yamaguchi et al. |

FOREIGN PATENT DOCUMENTS

| | | | |
|---|---|---|---|
| JP | 2000183476 | A | 6/2000 |
| JP | 2002171037 | A | 6/2002 |
| JP | 2002201072 | A | 7/2002 |
| JP | 2005089265 | A | 4/2005 |
| JP | 2008069044 | * | 3/2008 ........... C04B 35/584 |
| JP | 5046086 | B2 | 10/2012 |
| WO | 9854761 | A1 | 12/1998 |
| WO | 2010109960 | A1 | 9/2010 |

* cited by examiner

METAL/CERAMIC BONDING SUBSTRATE AND METHOD FOR PRODUCING SAME

TECHNICAL FIELD

The present invention relates generally to a metal/ceramic bonding substrate and a method for producing the same. More specifically, the invention relates to a metal/ceramic bonding substrate wherein a metal plate is bonded to a ceramic substrate of aluminum nitride, and a method for producing the same.

BACKGROUND ART

Conventionally, power modules are used for controlling heavy-current for electric vehicles, electric railcars and machine tools. As insulating substrates for such power modules, there is used a metal/ceramic bonding circuit board wherein a metal circuit plate is bonded to the surface of a ceramic substrate.

Recently, there has been a great increase in the heating value of insulating substrates for power modules by the high-output and high-density packing characteristics of electronic parts, such as semiconductor chips, mounted on the substrates, and there has been a great increase in the use of metal/ceramic bonding circuit boards using a ceramic substrate of aluminum nitride sintered body having a high thermal conductivity.

Ceramic substrates used in such metal/ceramic bonding circuit boards are usually produced by sintering a plurality of molded bodies of aluminum nitride powder piled on each other. Therefore, in order to prevent the adhesion of ceramic substrates to each other, a release agent, such as boron nitride (BN) powder, is arranged between the molded bodies. This release agent remains on the surface of the ceramic substrates after sintering. If such ceramic substrates having the release agent remaining on the surface thereof are used, there is a problem in that the bonding strength of the ceramic substrate to the metal circuit plate of the metal/ceramic bonding circuit board is lowered.

In order to solve such a problem, there is proposed a method for bonding a metal plate to a ceramic substrate after a honing treatment for jetting abrasive grains to the surface of the ceramic substrate is carried out (see, e.g., Japanese Patent Laid-Open Nos. 2002-171037 and 2005-98265).

However, in such a method, the repeated generation of heat from electronic parts, such as semiconductor chips, mounted on the metal/ceramic bonding circuit board causes the deterioration of the strength of the ceramic substrate of the metal/ceramic bonding circuit board and/or causes cracks to be easily produced in the ceramic substrate, so that there is a problem in that the heat cycle resistance deteriorates.

DISCLOSURE OF THE INVENTION

It is therefore an object of the present invention to eliminate the aforementioned problems and to provide a metal/ceramic bonding substrate which has an excellent bonding strength of a ceramic substrate to a metal plate and which has an excellent heat cycle resistance, and a method for producing the same.

In order to accomplish the aforementioned object, the inventors have diligently studied and found that it is possible to produce a metal/ceramic bonding substrate, which has an excellent bonding strength of a ceramic substrate to a metal plate and which has an excellent heat cycle resistance, by bonding the metal plate to the ceramic substrate of aluminum nitride, wherein the ceramic substrate has a residual stress of not higher than −50 MPa and wherein a bonded surface of the ceramic substrate to the metal plate has an arithmetic average roughness Ra of 0.15 to 0.30 μm.

According to the present invention, a metal/ceramic bonding substrate comprises: a ceramic substrate of aluminum nitride; and a metal plate bonded to the ceramic substrate, wherein the ceramic substrate has a residual stress of not higher than −50 MPa and wherein a bonded surface of the ceramic substrate to the metal plate has an arithmetic average roughness Ra of 0.15 to 0.30 μm.

In this metal/ceramic bonding substrate, the bonded surface of the ceramic substrate to the metal plate preferably has a ten-point average roughness Rz of 0.7 to 1.1 μm and a maximum height Ry of 0.9 to 1.7 μm. The ceramic substrate preferably has a flexural strength of not higher than 500 MPa, and the thickness of a residual stress layer formed along the surface of the ceramic substrate is preferably 25 μm or less. The metal plate is preferably bonded to the ceramic substrate via a brazing filler metal, and the metal plate is preferably made of copper or a copper alloy.

According to the present invention, there is provided a method for producing a metal/ceramic bonding substrate, the method comprising the steps of: preparing a ceramic substrate of aluminum nitride and a metal plate; carrying out a treatment for jetting a slurry, which contains abrasive grains in a liquid, to a surface of the ceramic substrate so that the ceramic substrate has a residual stress of not higher than −50 MPa and so that the surface of the ceramic substrate to be bonded to the metal plate has an arithmetic average roughness Ra of 0.15 to 0.30 μm; and bonding the metal plate to the ceramic substrate obtained by the treatment.

In this method for producing a metal/ceramic bonding substrate, the slurry jetting treatment is preferably carried out so that the surface of the ceramic substrate to be bonded to the metal plate has a ten-point average roughness Rz of 0.7 to 1.1 μm. The slurry jetting treatment is preferably carried out so that the surface of the ceramic substrate to be bonded to the metal plate has a maximum height Ry of 0.9 to 1.7 μm. The slurry jetting treatment is preferably carried out so as to decrease a flexural strength of the ceramic substrate. The slurry jetting treatment is preferably carried out so that the ceramic substrate has a flexural strength of not higher than 500 MPa. The slurry jetting treatment is preferably carried out so that the thickness of a residual stress layer formed along the surface of the ceramic substrate is 25 μm or less. The metal plate is preferably bonded to the ceramic substrate via a brazing filler metal, and the metal plate is preferably made of copper or a copper alloy. The abrasive grains are preferably made of spherical alumina. The treatment for jetting the slurry containing the abrasive grains in the liquid is preferably a treatment for jetting a slurry, which contains 10 to 30% by volume of abrasive grains having a higher hardness than that of the ceramic substrate, for 0.02 to 1.0 second with compressed air so that a pressure applied to the surface of the ceramic substrate to be treated is in the range of from 0.10 MPa to 0.25 MPa.

Throughout the specification, the expression "residual stress" means a residual stress calculated from an angle of X-ray diffraction by the $\sin^2\varphi$ method, and means a compressed residual stress when the residual stress is indicated by "−" (minus) value and a tensile residual stress when the residual stress is indicated by "+" (plus) value.

Throughout the specification, the expression "residual stress layer" means a layer formed along the surface of a ceramic substrate, and means a compressed residual stress layer formed between the surface of a ceramic substrate and a portion of the ceramic substrate (a portion at a predetermined depth from the surface of the ceramic substrate), the portion having a fracture toughness value of 2.1 MPa·m$^{1/2}$ (which is substantially equal to the fracture toughness value of a usual aluminum nitride substrate).

According to the present invention, it is possible to produce a metal/ceramic bonding substrate which has an excellent bonding strength of a ceramic substrate to a metal plate and which has an excellent heat cycle resistance.

BEST MODE FOR CARRYING OUT THE INVENTION

Referring to the accompanying drawings, the preferred embodiment of a metal/ceramic bonding substrate and a method for producing the same according to the present invention will be described below in detail.

Figure 1:
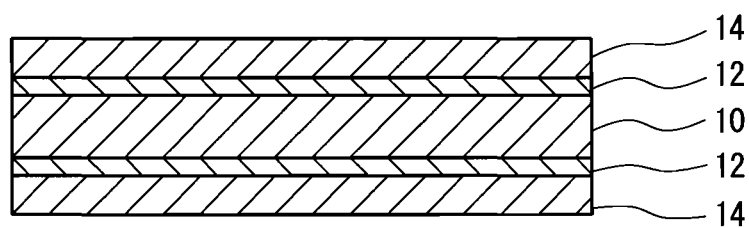
FIG. 1 is a sectional view of the preferred embodiment of a metal/ceramic bonding substrate according to the present invention.

As shown in FIG. 1, the preferred embodiment of a metal/ceramic bonding substrate according to the present invention comprises a ceramic substrate 10, and a metal plate 14 bonded (directly or via a brazing filler metal 12) to the ceramic substrate 10.

The residual stress of the ceramic substrate 10 is not higher than −50 MPa (a compressed residual stress of not lower than 50 MPa), and preferably not higher than −60 MPa. If the compressed residual stress is too high, there is some possibility that the ceramic substrate 10 may be broken. Therefore, the residual stress of the ceramic substrate 10 is preferably not lower than −200 MPa (a compressed residual stress of not higher than 200 MPa), and more preferably not lower than −150 MPa.

The residual stress of the ceramic substrate 10 can be derived by the X-ray stress measuring method which is generally used as a non-destructive measurement method for residual stress. In such an X-ray stress measuring method, the residual stress applied to a solid body can be non-destructively derived by measuring a crystal lattice spacing, which varies when a stress is applied to the solid body, as a variation in angle of X-ray diffraction. For example, an X-ray diffracting device can be used for irradiating characteristic X-rays to the ceramic substrate 10 of aluminum nitride sintered body at some incident angles φ, to measure an angle 2θ of diffraction at the diffraction peak on a predetermined crystal lattice plane of AlN at each of the incident angles φ to calculate the residual stress of the ceramic substrate 10 by the sin$^2$φ method (a method calculating a residual stress by multiplying a slope of a line, which is derived by plotting on a 2θ–sin$^2$φ line indicating the relationship between 26 and sin$^2$φ, by a predetermined pressure constant). Furthermore, if an internal stress (inherent strain) is generated in the solid body, the diffraction peak does not appear at the position of the predetermined angle 2θ, so that a deviation Δ2θ in angle occurs. Therefore, an X-ray source may be fixed to oscillate an X-ray detector around an X-ray irradiated point to increase the probability satisfying the conditions of diffraction to detect the amount of deviation Δ2θ in angle of X-ray diffraction (such a measuring method oscillating only an X-ray detector while fixing an X-ray source is called "φ$_0$ constant method").

Such calculation of the residual stress of the ceramic substrate 10 can be automatically carried out from the measured results of diffraction peak by the sin$^2$φ method if a commercially available X-ray stress measuring device (e.g., a fine part X-ray stress measuring device Auto MATE II produced by Rigaku Corporation) is used.

Furthermore, when the residual stress of the ceramic substrate 10 is indicated by a "−" (minus) value, it is a case where a compressed residual stress being a kind of internal stress (inherent strain) is applied to the interior of the ceramic substrate 10. In this case, if the compressed residual stress is higher, the absolute value of this stress is greater. On the other hand, when the residual stress of the ceramic substrate 10 is indicated by a "+" (plus) value, it is a case where a tensile residual stress is applied to the interior of the ceramic substrate 10.

The arithmetic average roughness Ra of the surface of the ceramic substrate 10 to be bonded to the metal plate 14 is in the range of from 0.15 μm to 0.30 μm, and preferably in the range of from 0.15 μm to 0.25 μm. The ten-point average roughness Rz of the surface of the ceramic substrate 10 to be bonded to the metal plate 14 is preferably in the range of from 0.7 μm to 1.1 μm. The maximum height Ry of the surface of the ceramic substrate 10 to be bonded to the metal plate 14 is preferably in the range of from 0.9 μm to 1.7 μm, and more preferably in the range of from 0.9 μm to 1.6 μm. If the arithmetic average roughness Ra of the surface of the ceramic substrate 10 to be bonded to the metal plate 14 exceeds 0.30 μm, AlN crystal grains are remarkably released from the surface of the ceramic substrate 10 of aluminum nitride sintered body to be treated. As a result, the surface roughness of the surface of the ceramic substrate 10 to be treated is too large, so that the effect of improving the heat cycle resistance of the metal/ceramic bonding substrate is insufficient.

The flexural strength of the ceramic substrate 10 is preferably not higher than 500 MPa, more preferably not higher than 450 MPa, and most preferably not higher than 420 MPa. If the flexural strength of the ceramic substrate 10 exceeds 500 MPa, there are some cases where the heat cycle resistance of the metal/ceramic bonding substrate may be deteriorated. Furthermore, if the flexural strength of the ceramic substrate 10 is lower than 250 MPa, the heat cycle resistance of the ceramic substrate 10 is deteriorated. Therefore, the flexural strength of the ceramic substrate 10 is preferably not lower than 250 MPa, and more preferably not lower than 300 MPa.

Figure 2:
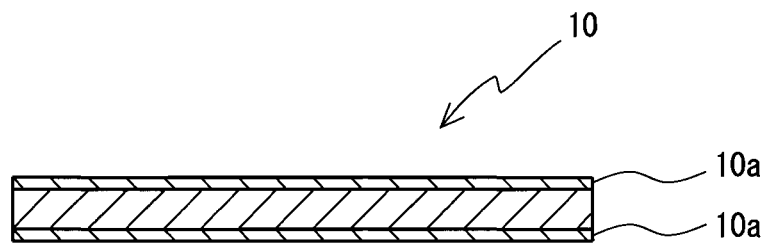
FIG. 2 is a sectional view of the ceramic substrate of the metal/ceramic bonding substrate of FIG. 1.

As shown in FIG. 2, the residual stress layer 10a is preferably formed along the surface of the ceramic substrate 10, and the thickness of the residual stress layer 10a is preferably not greater than 25 μm.

In the preferred embodiment of a method for producing a metal/ceramic bonding substrate according to the present invention, in a method for producing a metal/ceramic bonding substrate wherein the metal plate 14 is bonded (directly or via the brazing filler metal 12) to the ceramic substrate 10, an aluminum nitride substrate is used as the ceramic substrate 10, and a wet blasting treatment (a wet jetting or liquid honing treatment) for jetting a slurry, which contains abrasive grains in a liquid, to a surface of the ceramic substrate 10 so that the ceramic substrate 10 has a residual stress of not higher than −50 MPa (a compressed residual stress of not lower than 50 MPa), preferably not higher than −60 MPa, and so that the surface of the ceramic substrate 10 to be bonded to the metal plate 14 has an arithmetic average roughness Ra of 0.15 to 0.30 µm, preferably 0.15 to 0.25 µm, and then, the metal plate 14 is bonded to the ceramic substrate 10 obtained by this treatment. The wet blasting treatment is carried out so that the ten-point average roughness Rz of the surface of the ceramic substrate 10 to be bonded to the metal plate 14 is preferably in the range of from 0.7 µm to 1.1 µm. The wet blasting treatment is carried out so that the maximum height Ry of the surface of the ceramic substrate 10 to be bonded to the metal plate 14 is preferably in the range of from 0.9 µm to 1.7 µm and more preferably in the range of 0.9 µm to 1.6 µm. The wet blasting treatment is preferably carried out so as to decrease the flexural strength of the ceramic substrate 10. The wet blasting treatment is carried out so that the flexural strength of the ceramic substrate 10 is preferably not higher than 500 MPa, more preferably not higher than 450 MPa and most preferably not higher than 420 MPa while it is preferably not lower than 250 MPa and more preferably not lower than 300 MPa. Moreover, the wet blasting treatment is preferably carried out so that the thickness of the residual stress layer 10a formed along the surface of the ceramic substrate 10 is not larger than 25 µm.

In this preferred embodiment of the method for producing the metal/ceramic bonding substrate, an aluminum nitride substrate of aluminum nitride sintered body is used as the ceramic substrate 10. This aluminum nitride sintered body may be an aluminum nitride sintered body preferably having an average crystalline particle diameter of 0.5 to 20 µm and more preferably having an average crystalline particle diameter of 2 to 7 µm. Such an aluminum nitride sintered body can be derived by sintering a molded body of aluminum nitride powder having an average particle diameter of 0.1 to 15 µm and preferably having an average particle diameter of 0.5 to 5 µm.

This molded body of aluminum nitride powder may contain a sintering additive, an organic binder or the like if necessary. The sintering additive may be, for example, a rare earth metal oxide, such as yttrium oxide ($Y_2O_3$), erbium oxide ($Er_2O_3$) or ytterbium oxide ($Yb_2O_3$), an oxide of alkaline earth metal element, such as Ca, Ba or Sr, or the like. In particular, the sintering additive is preferably yttrium oxide. The amount of the sintering additive added to the molded body of aluminum nitride powder is preferably in the range of from 1 wt % to 10 wt % with respect to the aluminum nitride powder. If the amount of the sintering additive exceeds 10 wt %, there is some possibility that the deterioration of the thermal conductivity of the aluminum nitride sintered body or the like may be caused. On the other hand, if the amount of the sintering additive is less than 1 wt %, there is some possibility that the sinterability of the aluminum nitride sintered body may be deteriorated to increase the number or size of pores or the like. The organic binder may be, for example, any one of polyvinyl butyral, ethyl celluloses, acrylic resins and so forth. In order to suitably mold the aluminum nitride powder, the organic binder is preferably any one of acrylic resins and polyvinyl butyral.

The thickness of the aluminum nitride sintered body is preferably in the range of from 0.3 mm to 1.5 mm. If the thickness of the aluminum nitride sintered body exceeds 1.5 mm, there are some cases where the thermal resistance of the ceramic substrate 10 is increased to deteriorate the radiation performance thereof. On the other hand, if the thickness of the aluminum nitride sintered body is less than 0.3 mm, there are some cases where the strength of the ceramic substrate 10 is greatly deteriorated and the withstand voltage thereof is lowered, so that the reliability of the metal/ceramic bonding substrate is lowered.

In this preferred embodiment of the method for producing the metal/ceramic bonding substrate, the wet blasting treatment for jetting the slurry, which contains the abrasive grains in the liquid, to the surface of the ceramic substrate 10 is carried out. The abrasive grains in the slurry used for this wet blasting treatment are preferably abrasive grains having a higher hardness than that of the aluminum nitride sintered body. In particular, the abrasive grains preferably have a higher Vickers hardness Hv than that of the aluminum nitride sintered body by 50 or more, and more preferably have a higher Vickers hardness Hv than that of the aluminum nitride sintered body by 100 or more (particularly, abrasive grains having a Vickers hardness Hv of 1060 to 2500). Such abrasive grains may be abrasive grains of alumina, zirconia, silicon carbide or the like. Industrially, abrasive grains of alumina are preferably used since they are easily available. The average particle diameter of the abrasive grains is preferably in the range of from 10 µm to 60 µm and more preferably in the range of from 15 µm to 30 µm. The shape of the abrasive grains is preferably spherical.

The liquid of the slurry may be a liquid capable of dispersing the abrasive grains. For example, the liquid may be water, or an organic solvent such as alcohols. The content of the abrasive grains in the slurry is preferably in the range of from 10% to 30% by volume. If the content of the abrasive grains is less than 10% by volume, the effect of improving the heat cycle resistance of the metal/ceramic bonding substrate is insufficient. On the other hand, if the content of the abrasive grains exceeds 30% by volume, the hole of the nozzle for jetting the slurry is easily blocked, and the circulatory failure of the abrasive grains is easy to occur.

The slurry, together with compressed air, is preferably jetted to the surface of the ceramic substrate 10 to be treated, so that the pressure applied to the surface of the ceramic substrate 10 to be treated is in the range of from 0.10 MPa to 0.25 MPa. If the pressure applied to the surface of the ceramic substrate 10 to be treated exceeds 0.25 MPa, AlN crystal grains are remarkably released from the surface of the ceramic substrate 10 of aluminum nitride sintered body to be treated even if the particle diameter of the abrasive grains is small. As a result, the surface roughness of the surface of the ceramic substrate 10 to be treated is too large, so that the effect of improving the heat cycle resistance of the metal/ceramic bonding substrate is insufficient.

The time (treating time) for jetting the slurry to the surface of the ceramic substrate 10 to be treated is preferably in the range of from 0.02 seconds to 1.0 second, and more preferably in the range of from 0.05 seconds to 0.2 seconds. If the treating time is shorter than 0.02 seconds, the removal of the release agent from the ceramic substrate 10 is insufficient, so that the effect of improving the strength and heat cycle resistance of the metal/ceramic bonding substrate is insufficient. On the other hand, if the treating time exceeds 1.0 second, AlN crystal grains are remarkably released from the surface of the ceramic substrate 10 of aluminum nitride sintered body to be treated, so that the surface roughness of the surface of the ceramic substrate 10 to be treated is too large. As a result, the effect of improving the heat cycle resistance of the metal/ceramic bonding substrate is insufficient, and the productivity thereof is deteriorated.

In this preferred embodiment of the method for producing the metal/ceramic bonding substrate, the conditions of the wet blasting treatment may be previously determined so that the ceramic substrate 10 has a residual stress of not higher than −50 MPa (a compressed residual stress of not lower than 50 MPa), preferably not higher than −60 MPa, and so that the surface of the ceramic substrate 10 to be bonded to the metal plate 14 has an arithmetic average roughness Ra of 0.15 to 0.30 μm (more preferably, the surface of the ceramic substrate 10 to be bonded to the metal plate 14 has a ten-point average roughness Rz of 0.7 to 1.1 μm and a maximum height Ry of 0.9 to 1.7 μm, the ceramic substrate 10 having a flexural strength of not higher than 500 MPa, and the thickness of the residual stress layer 10a formed along the surface of the ceramic substrate 10 being not larger than 25 μm).

The metal plate 14 is bonded, directly or via the brazing filler metal 12, to at least one side of the ceramic substrate 10 thus wet-blasted. The metal plate 14 may be a metal plate of copper or a copper alloy, a metal plate of aluminum or an aluminum alloy, or the like. When the metal plate 14 is bonded to the ceramic substrate 10 via the brazing filler metal 12, there is preferably used a brazing filler active metal containing 0.5 to 10 wt % of at least one active metal, which is selected from Ti, Zr, Hf, Nb and so forth, in a brazing filler metal of Ag—Cu. After such a brazing filler metal 12 is applied on the ceramic substrate 10 so as to have a thickness of about 5 to 30 μm, preferably about 10 to 20 μm, to laminate the metal plate 14 thereto, the metal/ceramic bonding substrate can be produced by carrying out a heat treatment at a temperature of about 700 to 900° C.

Furthermore, etching resists having a shape of a predetermined circuit pattern and a shape of a predetermined heat sink are formed on the metal plates 14 of the metal/ceramic bonding substrate, respectively, and unnecessary portions of the metal plate 14 and brazing filler metal 12 are removed by etching with chemicals. Thereafter, the metal plates having the shapes of the circuit pattern and heat sink are plated, so that a metal/ceramic circuit board can be produced.

Examples of a metal/ceramic bonding substrate and a method for producing the same according to the present invention will be described below in detail.

Example 1

First, there was prepared a ceramic substrate of aluminum nitride sintered body having a length of 51.5 mm×a width of 46.5 mm×a thickness of 0.6 mm.

The flexural strength of this ceramic substrate was measured by carrying out a three-point bending test (corresponding to "Bending Strength Test Procedure for Fine Ceramics" described on JIS R1601) by applying a load so as to cause the upper support to contact the ceramic substrate in a direction perpendicular to the longitudinal direction thereof at a loading rate of 0.5 mm/min and a span length of 30 mm as measuring conditions. As a result, the (initial) flexural strength of the ceramic substrate was 450 MPa.

With respect to the ceramic substrate, the angle of diffraction at the diffraction peak was measured by means of an X-ray stress measuring device (a fine part X-ray stress measuring device Auto MATE II produced by Rigaku Corporation), to calculate the residual stress thereof. As a result, the average value of the residual stresses applied to the ceramic substrate at optional four points (n=4) on the surface of the ceramic substrate to be treated was −26 MPa which was a compressed residual stress. Furthermore, in the measurement of the angle of diffraction at the diffraction peak, the $\varphi_0$ constant method (a measuring method oscillating only an X-ray detector while fixing an X-ray source) was used as an X-ray incident method, and the ISO inclination method (a method using an optical system wherein the set surface of the lattice plane angle $\varphi$ and the scan surface of the angle $2\theta$ of diffraction were on the same plane) was used as a detector scanning method. In addition, the Cr—Kα line was used as a characteristic X-ray, and there were set an X-ray tube voltage of 40 kV, an X-ray tube current of 40 mA, and an X-ray beam diameter of $\varphi 2$ mm, and an X-ray irradiation time of 60 seconds. Moreover, the (112) plane of AlN around $2\theta=120.4°$ in a distortionless state was used as the predetermined crystal lattice plane of AlN, and there were set an oscillation angle of $\varphi$ angle being±1°, the measuring number of $\varphi$ being 10, and an analyzed angle of 117.9° to 122.5.

With respect to the surface roughness of the ceramic substrate, the arithmetic average roughness Ra and ten-point average roughness Rz being parameters indicating the surface roughness on the basis of JIS B0601 (1994) were calculated from the results measured by a contact type surface roughness measuring device (SJ201P produced by Mitsutoyo Corporation). As a result, the arithmetic average roughness Ra was 0.207 μm, and the ten-point average roughness Rz was 2.105 μm.

Then, each surface of the ceramic substrate was treated by a wet blasting apparatus (PFE-300 produced by Macoho Co., Ltd.). The wet blasting treatment was carried out by jetting a slurry, which contained 20% by volume of abrasive grains of spherical alumina having an average particle diameter ($D_{50}$) of 20 to 24 μm in water, (from a nozzle having an opening area of 46.5 mm²) to the surface of the ceramic substrate for 0.05 seconds at an air pressure (discharge pressure) of 0.125 MPa (so that the area of the surface, to which the slurry was jetted, was 48.8 mm²). Furthermore, assuming that the discharge pressure was P1 (MPa), the pressure to the surface of the ceramic substrate to be treated by the slurry was P2 (MPa), the opening area of the nozzle was S1 (mm²), and the area of the surface of the ceramic substrate to be treated by the jetting of the slurry was S2 (mm²), the pressure P2 applied to the surface of the ceramic substrate to be treated was derived from P2=P1× S1/S2. As a result, the pressure P2 was 0.119 MPa.

The flexural strength of the ceramic substrate after the wet blasting treatment was measured by the same method as the above-described method. As a result, the flexural strength was 408 MPa.

The residual stress of to the ceramic substrate after the wet blasting treatment was derived by the same method as the above-described method. As a result, the average value of the residual stresses applied to the ceramic substrate was −78 MPa which was a compressed residual stress.

With respect to the surface roughness of the ceramic substrate after the wet blasting treatment, the arithmetic average roughness Ra, the ten-point average roughness Rz and the maximum height Ry were calculated by the same method as the above-described method. As a result, the arithmetic average roughness Ra was 0.180 μm, the ten-point average roughness Rz was 0.860 μm, and the maximum height Ry was 1.080 μm.

Then, a brazing filler metal of Ag—Cu—Ti consisting of 30 wt % of Cu, 1.5 wt % of Ti and the balance being Ag was applied on both sides of the ceramic substrate after the wet blasting treatment. Thereafter, a metal plate (for circuit pattern) of oxygen-free copper having a length of 51.5 mm×a width of 46.5 mm×a thickness of 0.25 mm, and a metal plate (for radiation of heat) of oxygen-free copper having a length of 51.5 mm×a width of 46.5 mm×a thickness of 0.25 mm were laminated to both sides of the ceramic substrate via the brazing filler metal, respectively, to be fed into a bonding furnace to be heated at 850° C., in vacuum, so that the metal plates were bonded to the ceramic substrate. After the bonded article was taken out of the furnace, etching resists having a shape of a predetermined circuit pattern and a shape of a predetermined heat sink were formed on the metal plates, respectively, and unnecessary portions of the metal plate and brazing filler metal were removed by etching with chemicals. Thereafter, plating films having a thickness of 2 μm were formed on the metal plates having the shapes of the circuit pattern and heat sink, respectively, by Ni—P electroless plating to produce a metal/ceramic circuit board.

With respect to ten metal/ceramic circuit boards thus produced, the (initial) flexural strength thereof before a furnace passing treatment (a heat cycle wherein the circuit board was cooled to a room temperature after it was heated at 380° C., for ten minutes) was measured. As a result, the average value of the (initial) flexural strengths of the ten metal/ceramic circuit boards was 600 MPa. After the furnace passing treatment was repeated three times, the average value of the flexural strengths of the ten metal/ceramic circuit boards was 545 MPa, and the minimum value of the flexural strengths of the ten metal/ceramic circuit boards was 419 MPa. Furthermore, the flexural strength of the metal/ceramic circuit board was measured by the same method as that for the ceramic substrate. After the furnace passing treatment was repeated fifty times, the metal plate was removed from the metal/ceramic circuit board, and the ceramic substrate was observed by means of a magnifying glass with a magnifying power of 40. As a result, it was confirmed that cracks (through-cracks) passing through the ceramic substrate in thickness directions thereof were not produced even if the furnace passing treatment was repeated fifty times.

Furthermore, after the metal plate was removed from the metal/ceramic circuit board, the residual stress of the ceramic substrate was derived by the same method as that for the ceramic substrate after the wet blasting treatment. As a result, it was substantially equal to that of the ceramic substrate after the wet blasting treatment (before the preparation of the metal/ceramic circuit board).

Example 2

The wet blasting treatment for the ceramic substrate was carried out by the same method as that in Example 1, except that the discharge pressure was 0.150 MPa and that the pressure to the surface of the ceramic substrate to be treated was 0.143 MPa.

The flexural strength, residual stress and surface roughness of the ceramic substrate after the wet blasting treatment were derived by the same methods as those in Example 1. As a result, the flexural strength was 416 MPa, and the residual stress was −90 MPa. As the parameters indicating the surface roughness, the arithmetic average roughness Ra was 0.182 μm, the ten-point average roughness Rz was 0.980 μm, and the maximum height Ry was 1.340 μm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 650 MPa. After the furnace passing treatment was repeated three times, the average value of the flexural strengths was 500 MPa, and the minimum value of the flexural strengths was 427 MPa. It was confirmed that through-cracks in thickness directions of the ceramic substrate were not produced even if the furnace passing treatment was repeated fifty times.

Example 3

The wet blasting treatment for the ceramic substrate was carried out by the same method as that in Example 1, except that the discharge pressure was 0.175 MPa and that the pressure to the surface of the ceramic substrate to be treated was 0.167 MPa.

The flexural strength, residual stress and surface roughness of the ceramic substrate after the wet blasting treatment were derived by the same methods as those in Example 1. As a result, the flexural strength was 336 MPa, and the residual stress was −80 MPa. As the parameters indicating the surface roughness, the arithmetic average roughness Ra was 0.176 μm, the ten-point average roughness Rz was 0.780 μm, and the maximum height Ry was 1.000 μm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 615 MPa. After the furnace passing treatment was repeated three times, the average value of the flexural strengths was 505 MPa, and the minimum value of the flexural strengths was 377 MPa. It was confirmed that through-cracks in thickness directions of the ceramic substrate were not produced even if the furnace passing treatment was repeated fifty times.

Example 4

The wet blasting treatment for the ceramic substrate was carried out by the same method as that in Example 1, except that the discharge pressure was 0.200 MPa and that the pressure to the surface of the ceramic substrate to be treated was 0.191 MPa.

The flexural strength, residual stress and surface roughness of the ceramic substrate after the wet blasting treatment were derived by the same methods as those in Example 1. As a result, the flexural strength was 329 MPa, and the residual stress was −95 MPa. As the parameters indicating the surface roughness, the arithmetic average roughness Ra was 0.180 μm, the ten-point average roughness Rz was 0.820 μm, and the maximum height Ry was 1.640 μm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 600 MPa. After the furnace passing treatment was repeated three times, the average value of the flexural strengths was 550 MPa, and the minimum value of the flexural strengths was 475 MPa. It was confirmed that through-cracks in thickness directions of the ceramic substrate were not produced even if the furnace passing treatment was repeated fifty times.

Example 5

The wet blasting treatment for the ceramic substrate was carried out by the same method as that in Example 1, except that the discharge pressure was 0.225 MPa and that the pressure to the surface of the ceramic substrate to be treated was 0.214 MPa.

The flexural strength, residual stress and surface roughness of the ceramic substrate after the wet blasting treatment were derived by the same methods as those in Example 1. As a result, the flexural strength was 373 MPa, and the residual stress was −75 MPa. As the parameters indicating the surface roughness, the arithmetic average roughness Ra was 0.207 μm, the ten-point average roughness Rz was 0.967 μm, and the maximum height Ry was 1.267 μm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 597 MPa. After the furnace passing treatment was repeated three times, the average value of the flexural strengths was 550 MPa, and the minimum value of the flexural strengths was 394 MPa. It was confirmed that through-cracks in thickness directions of the ceramic substrate were not produced even if the furnace passing treatment was repeated fifty times.

Example 6

The wet blasting treatment for the ceramic substrate was carried out by the same method as that in Example 1, except that the abrasive grains of spherical alumina having an average particle diameter ($D_{50}$) of 49 to 53 μm were used.

The flexural strength, residual stress and surface roughness of the ceramic substrate after the wet blasting treatment were derived by the same methods as those in Example 1. As a result, the flexural strength was 339 MPa, and the residual stress was −80 MPa. As the parameters indicating the surface roughness, the arithmetic average roughness Ra was 0.158 μm, the ten-point average roughness Rz was 0.940 μm, and the maximum height Ry was 1.260 μm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 585 MPa. After the furnace passing treatment was repeated three times, the average value of the flexural strengths was 495 MPa, and the minimum value of the flexural strengths was 395 MPa. It was confirmed that through-cracks in thickness directions of the ceramic substrate were not produced even if the furnace passing treatment was repeated fifty times.

Example 7

The wet blasting treatment for the ceramic substrate was carried out by the same method as that in Example 5, except that the abrasive grains of spherical alumina having an average particle diameter ($D_{50}$) of 49 to 53 μm were used.

The flexural strength, residual stress and surface roughness of the ceramic substrate after the wet blasting treatment were derived by the same methods as those in Example 1. As a result, the flexural strength was 283 MPa, and the residual stress was −100 MPa. As the parameters indicating the surface roughness, the arithmetic average roughness Ra was 0.160 μm, the ten-point average roughness Rz was 1.001 μm, and the maximum height Ry was 1.489 μm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 534 MPa. After the furnace passing treatment was repeated three times, the average value of the flexural strengths was 464 MPa, and the minimum value of the flexural strengths was 393 MPa. It was confirmed that through-cracks in thickness directions of the ceramic substrate were produced after the furnace passing treatment was repeated thirty times, although through-cracks in thickness directions of the ceramic substrate were not produced even if the furnace passing treatment was repeated twenty five times.

Comparative Example 1

Both sides of a ceramic substrate similar to that in Example 1 were treated by means of a honing device (jet scrubbing machine produced by Ishiihyoki Co., Ltd.). The honing treatment was carried out by jetting abrasive grains of alumina having an average particle diameter of 50 μm (particle size #280) to the surface of the ceramic substrate for 15 seconds at an air pressure (discharge pressure) of 0.300 MPa (from a nozzle having an opening area of 3 mm$^2$) (so that the area of the surface to be treated by jetting abrasive grains was 159 mm$^2$). Furthermore, assuming that the discharge pressure was P1 (MPa), the pressure applied to the surface of the ceramic substrate to be treated by the slurry was P2 (MPa), the opening area of the nozzle was S1 (mm$^2$), and the area of the surface to be treated by jetting the slurry was S2 (mm$^2$), the pressure P2 applied to the surface of the ceramic substrate to be treated was derived from P2=P1×S1/S2. As a result, the pressure P2 was 0.006 MPa.

The flexural strength, residual stress and surface roughness of the ceramic substrate after the honing treatment were derived by the same methods as those in Example 1. As a result, the flexural strength was 549 MPa, and the residual stress was −40 MPa. As the parameters indicating the surface roughness, the arithmetic average roughness Ra was 0.135 μm, the ten-point average roughness Rz was 0.702 μm, and the maximum height Ry was 0.980 μm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 545 MPa. After the furnace passing treatment was repeated three times, the average value of the flexural strengths was 282 MPa, and the minimum value of the flexural strengths was 229 MPa. It was confirmed that through-cracks in thickness directions of the ceramic substrate were produced after the furnace passing treatment was repeated twenty times.

Comparative Example 2

The honing treatment for the ceramic substrate was carried out by the same method as that in Comparative Example 1, except that the holing treatment in Comparative Example 1 was carried out twice.

The flexural strength, residual stress and surface roughness of the ceramic substrate after the honing treatment were derived by the same methods as those in Example 1. As a result, the flexural strength was 568 MPa, and the residual stress was −43 MPa. As the parameters indicating the surface roughness, the arithmetic average roughness Ra was 0.153 μm, the ten-point average roughness Rz was 0.794 μm, and the maximum height Ry was 0.950 μm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 555 MPa. After the furnace passing treatment was repeated three times, the average value of the flexural strengths was 330 MPa, and the minimum value of the flexural strengths was 275 MPa. It was confirmed that through-cracks in thickness directions of the ceramic substrate were produced after the furnace passing treatment was repeated twenty times.

Comparative Example 3

The wet blasting treatment for the ceramic substrate was carried out by the same method as that in Example 1, except that a slurry containing 20% by volume of abrasive grains of alumina having an average particle diameter 57 µm (particle size #320) in water was used, the discharge pressure was 0.150 MPa, and the pressure to the surface of the ceramic substrate to be treated was 0.143 MPa.

The flexural strength, residual stress and surface roughness of the ceramic substrate after the wet blasting treatment were derived by the same methods as those in Example 1. As a result, the flexural strength was 434 MPa, and the residual stress was −37 MPa. As the parameters indicating the surface roughness, the arithmetic average roughness Ra was 0.134 µm, the ten-point average roughness Rz was 0.774 µm, and the maximum height Ry was 0.992 µm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 542 MPa. After the furnace passing treatment was repeated three times, the average value of the flexural strengths was 252 MPa, and the minimum value of the flexural strengths was 182 MPa. It was confirmed that cracks were produced in the ceramic substrate after the furnace passing treatment was repeated twenty five times.

Comparative Example 4

The wet blasting treatment for the ceramic substrate was carried out by the same method as that in Example 1, except that a slurry containing 20% by volume of abrasive grains of alumina having an average particle diameter 28 µm (particle size #600) in water was used, the discharge pressure was 0.250 MPa, and the pressure to the surface of the ceramic substrate to be treated was 0.238 MPa.

The flexural strength, residual stress and surface roughness of the ceramic substrate after the wet blasting treatment were derived by the same methods as those in Example 1. As a result, the flexural strength was 392 MPa, and the residual stress was −38 MPa. As the parameters indicating the surface roughness, the arithmetic average roughness Ra was 0.186 µm, the ten-point average roughness Rz was 1.294 µm, and the maximum height Ry was 1.758 µm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 547 MPa. After the furnace passing treatment was repeated three times, the average value of the flexural strengths was 248 MPa, and the minimum value of the flexural strengths was 210 MPa. It was confirmed that cracks were produced in the ceramic substrate after the furnace passing treatment was repeated twenty times.

Comparative Example 5

The wet blasting treatment for the ceramic substrate was carried out by the same method as that in Example 1, except that the discharge pressure was 0.250 MPa, and the pressure to the surface of the ceramic substrate to be treated was 0.238 MPa.

The flexural strength, residual stress and surface roughness of the ceramic substrate after the wet blasting treatment were derived by the same methods as those in Example 1. As a result, the flexural strength was 375 MPa, and the residual stress was −80 MPa. As the parameters indicating the surface roughness, the arithmetic average roughness Ra was 0.578 µm, the ten-point average roughness Rz was 2.988 µm, and the maximum height Ry was 3.966 µm.

By the same methods as those in Example 1, metal/ceramic bonding substrates were produced, the flexural strength thereof was measured, and the presence of through-cracks after the furnace passing treatment was observed. As a result, the average value of the (initial) flexural strengths before the furnace passing treatment was 509 MPa. After the furnace passing treatment was repeated three times, the average value of the flexural strengths was 212 MPa, and the minimum value of the flexural strengths was 173 MPa. It was confirmed that cracks were produced in the ceramic substrate after the furnace passing treatment was repeated twenty times.

In order to derive the thickness of the residual stress layer of each of the ceramic substrates after the wet blasting treatment obtained in Examples 1-7 and Comparative Examples 1-5, the surface portion of each of the ceramic substrates was removed by a thickness of 25 µm by the abrasive machining, and then, a Vickers indenter was hammered in the abrasive-machined surface to measure the length of cracks extending from the impression to calculate a fracture toughness value thereof. As a result, the fracture toughness value of each of the ceramic substrates was not higher than 2.1 MPa·m$^{1/2}$. From these results, it was found that the thickness of the residual stress layer of each of the ceramic substrates was not greater than 25 µm.

Furthermore, the abrasive machining for the ceramic substrate was carried out by means of grinding stones (produced by Noritake Co., Ltd.) using a horizontal spindle reciprocating surface grinding machine (YCC-H1 produced by Yokohama Ceramics Co., Ltd.) as a grinding machine. The fracture toughness value was calculated as follows. First, the length of cracks extending from the impression was measured at an indentation load of 49 N for a holding time of 15 seconds by means of a Vickers hardness testing machine (AVD-CO produced by Mitsutoyo Corporation) on the basis of the IF (Indentation Fracture) method described on JIS R1617 (2002). Then, the fracture toughness value was calculated from $Kc=0.026(E^{1/2}P^{1/2}a)/C^{3/2}$ (wherein Kc denotes a fracture toughness value (MPa·m$^{1/2}$) and E denotes a Young's modulus (Pa)=280 MPa, P denoting an indentation load (N), C denoting half (m) of the average value of the lengths of the cracks, and a denoting half of the average value of the length of the diagonals of the impression).

Each of the metal/ceramic circuit boards obtained in Examples 5, 7, Comparative Example 1 and 5 was cut in the thickness directions thereof, and a portion of the cross section near the bonded surface was observed with respect to 70 fields of vision by means of a field emission type scanning electron microscope (FE-SEM) (JSM-6700F produced by JEOL Ltd.) with a magnifying power of 10,000. As a result, it was found that there were formed 15 (Example 5), 16 (Example 7), 2 (Comparative Example 1) and 20 (Comparative Example 5) superfine cracks having a width of not greater than 0.1 µm (extending in the thickness directions of the metal/ceramic circuit board by about 5 µm) and that the brazing filler metal entered the superfine cracks. Since the number of the brazing filler metal entering superfine cracks is large in Examples 5 and 7, it is considered that it is possible to prevent through-cracks from being produced in the thickness directions of the ceramic substrate even if the furnace passing treatment is carried out fifty times.

Table 1 shows the conditions in the wet blasting treatment and honing treatment for each of the ceramic substrates in these examples and comparative examples. Table 2 shows the flexural strength, the residual stress, the thickness of residual stress layer, the surface roughness and the number of superfine cracks with respect to the ceramic substrate after the treatment. Table 3 shows the flexural strengths of the metal/ceramic circuit boards produced using the ceramic substrates before and after the furnace passing treatment, and the number of the furnace passing treatments by which the through-cracks are produced.

TABLE 1

| | Abrasive Grains | | Discharge Pressure (MPa) | Pressure of Surface to be treated (MPa) | Treatment Time (sec) |
|---|---|---|---|---|---|
| Surface Treatment | Materials | Average Particle Diameter (µm) | | | |
| Ex. 1 | Wet Blast | Spherical Almina | 20~24 | 0.125 | 0.119 | 0.05 |
| Ex. 2 | Wet Blast | Spherical Almina | 20~24 | 0.150 | 0.143 | 0.05 |
| Ex. 3 | Wet Blast | Spherical Almina | 20~24 | 0.175 | 0.167 | 0.05 |
| Ex. 4 | Wet Blast | Spherical Almina | 20~24 | 0.200 | 0.191 | 0.05 |
| Ex. 5 | Wet Blast | Spherical Almina | 20~24 | 0.225 | 0.214 | 0.05 |
| Ex. 6 | Wet Blast | Spherical Almina | 49~53 | 0.125 | 0.119 | 0.05 |
| Ex. 7 | Wet Blast | Spherical Almina | 49~53 | 0.225 | 0.214 | 0.05 |
| Comp. 1 | Honing | Almina | 50 (Particle Size #280) | 0.300 | 0.006 | 15 |
| Comp. 2 | Honing | Almina | 50 (Particle Size #280) | 0.300 | 0.006 | 15 Twice |
| Comp. 3 | Wet Blast | Almina | 57 (Particle Size #320) | 0.150 | 0.143 | 0.05 |
| Comp. 4 | Wet Blast | Almina | 28 (Particle Size #600) | 0.250 | 0.238 | 0.05 |
| Comp. 5 | Wet Blast | Spherical Almina | 20~24 | 0.250 | 0.238 | 0.05 |

TABLE 2

| | Flexural Strength (MPa) | Residual Stress (MPa) | Surface Roughness | | | Thickness of Residual Stress Layer (µm) | Number of Superfine Cracks |
|---|---|---|---|---|---|---|---|
| | | | Ra (µm) | Rz (µm) | Ry (µm) | | |
| Ex. 1 | 408 | −78 | 0.180 | 0.860 | 1.080 | 25 or less | — |
| Ex. 2 | 416 | −90 | 0.182 | 0.980 | 1.340 | 25 or less | — |
| Ex. 3 | 336 | −80 | 0.176 | 0.780 | 1.000 | 25 or less | — |
| Ex. 4 | 329 | −95 | 0.180 | 0.820 | 1.640 | 25 or less | — |
| Ex. 5 | 373 | −75 | 0.207 | 0.967 | 1.267 | 25 or less | 15 |
| Ex. 6 | 339 | −80 | 0.158 | 0.940 | 1.260 | 25 or less | — |
| Ex. 7 | 283 | −100 | 0.160 | 1.001 | 1.489 | 25 or less | 16 |
| Comp. 1 | 549 | −40 | 0.135 | 0.702 | 0.980 | 25 or less | 2 |
| Comp. 2 | 568 | −43 | 0.153 | 0.794 | 0.950 | 25 or less | — |
| Comp. 3 | 434 | −37 | 0.134 | 0.774 | 0.922 | 25 or less | — |
| Comp. 4 | 392 | −38 | 0.186 | 1.294 | 1.758 | 25 or less | — |
| Comp. 5 | 375 | −80 | 0.578 | 2.988 | 3.966 | 25 or less | 20 |

TABLE 3

| | Flexural Strength (MPa) | | | |
|---|---|---|---|---|
| | Initial Average Value | Average Value after Furnace Passing Treatment | Minimum Value after Furnace Passing Treatment | Number of Furnace Passing Treatments |
| Ex. 1 | 600 | 545 | 419 | 50 or more |
| Ex. 2 | 650 | 500 | 427 | 50 or more |
| Ex. 3 | 615 | 505 | 377 | 50 or more |
| Ex. 4 | 600 | 550 | 475 | 50 or more |
| Ex. 5 | 597 | 550 | 394 | 50 or more |
| Ex. 6 | 585 | 495 | 395 | 50 or more |
| Ex. 7 | 534 | 464 | 393 | 25~30 |
| Comp. 1 | 545 | 282 | 229 | 20 or less |
| Comp. 2 | 555 | 330 | 275 | 20 or less |
| Comp. 3 | 542 | 252 | 182 | 25 or less |
| Comp. 4 | 547 | 248 | 210 | 20 or less |
| Comp. 5 | 509 | 212 | 173 | 20 or less |

As can be seen from Tables 1 through 3, after the furnace passing treatments are carried out three times, the average value of the flexural strengths of the metal/ceramic circuit boards is a low value of 330 MPa or less (the minimum value thereof being a low value of 275 MPa or less) in Comparative Examples 1 through 5, whereas it is a high value of 464 MPa or more (the minimum value thereof being a high value of 377 MPa or more) in Examples 1 through 7. The number of the furnace passing treatments, by which the through-cracks are produced in the ceramic substrate, is a low value of 25 or less in Comparative Examples 1 through 5, whereas it is a high value of 50 or more in Examples 1 through 6 although it is in the range of 25 to 30 in Example 7. As can be seen from these results, the metal/ceramic circuit boards in Examples 1 through 7 have an excellent heat cycle resistance as compared with that in Comparative Examples 1 through 5.

The invention claimed is:

1. A metal/ceramic bonding substrate comprising:
a ceramic substrate of aluminum nitride; and
a metal plate bonded to the ceramic substrate, wherein the ceramic substrate has a residual stress of not higher than −50 MPa and wherein a bonded surface of the ceramic substrate to the metal plate has an arithmetic average roughness Ra of 0.15 to 0.30 μm, and
wherein said ceramic substrate has a flexural strength of 250-450 MPa.

2. A metal/ceramic bonding substrate as set forth in claim 1, wherein said bonded surface of the ceramic substrate to the metal plate has a ten-point average roughness Rz of 0.7 to 1.1 μm.

3. A metal/ceramic bonding substrate as set forth in claim 1, wherein said bonded surface of the ceramic substrate to the metal plate has a maximum height Ry of 0.9 to 1.7 μm.

4. A metal/ceramic bonding substrate as set forth in claim 1, wherein a thickness of a compressed residual stress layer formed along the surface of said ceramic substrate between the surface of the ceramic substrate and a portion of the ceramic substrate at a predetermined depth from the surface of the ceramic substrate is 25 μm or less.

5. A metal/ceramic bonding substrate as set forth in claim 1, wherein said metal plate is bonded to said ceramic substrate via a brazing filler metal.

6. A metal/ceramic bonding substrate as set forth in claim 1, wherein said metal plate is made of copper or a copper alloy.

7. A metal/ceramic bonding substrate as set forth in claim 1, wherein said arithmetic average roughness Ra is in the range of from 0.15 μm to 0.25 μm.

8. A method for producing a metal/ceramic bonding substrate, the method comprising the steps of:
preparing a ceramic substrate of aluminum nitride and a metal plate;
carrying out a treatment for jetting a slurry, which contains abrasive grains in a liquid, to a surface of the ceramic substrate so that the ceramic substrate has a residual stress of not higher than −50 MPa and so that the surface of the ceramic substrate to be bonded to the metal plate has an arithmetic average roughness Ra of 0.15 to 0.30 μm; and
bonding the metal plate to the ceramic substrate obtained by the treatment,
wherein the treated ceramic substrate has a flexural strength of 250-450 MPa.

9. A method for producing a metal/ceramic bonding substrate as set forth in claim 8, wherein the slurry jetting treatment is carried out so that the surface of the ceramic substrate to be bonded to the metal plate has a ten-point average roughness Rz of 0.7 to 1.1 μm.

10. A method for producing a metal/ceramic bonding substrate as set forth in claim 8, wherein the slurry jetting treatment is carried out so that the surface of the ceramic substrate to be bonded to the metal plate has a maximum height Ry of 0.9 to 1.7 μm.

11. A method for producing a metal/ceramic bonding substrate as set forth in claim 8, wherein the slurry jetting treatment is carried out so as to decrease a flexural strength of said ceramic substrate.

12. A method for producing a metal/ceramic bonding substrate as set forth in claim 8, wherein the slurry jetting treatment is carried out so that a thickness of a compressed residual stress layer formed along the surface of said ceramic substrate between the surface of the ceramic substrate and a portion of the ceramic substrate at a predetermined depth from the surface of the ceramic substrate is 25 μm or less.

13. A method for producing a metal/ceramic bonding substrate as set forth in claim 8, wherein said metal plate is bonded to said ceramic substrate via a brazing filler metal.

14. A method for producing a metal/ceramic bonding substrate as set forth in claim 8, wherein said metal plate is made of copper or a copper alloy.

15. A method for producing a metal/ceramic bonding substrate as set forth in claim 8, wherein said abrasive grains are made of spherical alumina.

16. A method for producing a metal/ceramic bonding substrate as set forth in claim 8, wherein the treatment for jetting the slurry containing the abrasive grains in the liquid is a treatment for jetting a slurry, which contains 10 to 30% by volume of abrasive grains having a higher hardness than that of said ceramic substrate, for 0.02 to 1.0 second with compressed air so that a pressure applied to the surface of said ceramic substrate to be treated is in the range of from 0.10 MPa to 0.25 MPa.

* * * * *